United States Patent
Vaudo et al.

(10) Patent No.: US 7,170,095 B2
(45) Date of Patent: Jan. 30, 2007

(54) SEMI-INSULATING GAN AND METHOD OF MAKING THE SAME

(75) Inventors: Robert P. Vaudo, New Milford, CT (US); Xueping Xu, Stamford, CT (US); George R. Brandes, Southbury, CT (US)

(73) Assignee: Cree Inc., Durham, NC (US)

( * ) Notice: Subject to any disclaimer, the term of this patent is extended or adjusted under 35 U.S.C. 154(b) by 0 days.

(21) Appl. No.: 10/618,024

(22) Filed: Jul. 11, 2003

(65) Prior Publication Data

US 2005/0009310 A1 Jan. 13, 2005

(51) Int. Cl.
*H01L 29/15* (2006.01)
*H01L 21/20* (2006.01)
*C23C 16/24* (2006.01)

(52) U.S. Cl. .................. 257/76; 438/479; 257/E33.023
(58) Field of Classification Search .................. 257/76; 438/479
See application file for complete search history.

(56) References Cited

U.S. PATENT DOCUMENTS

| | | | |
|---|---|---|---|
| 5,385,862 A | 1/1995 | Moustakas | |
| 5,679,152 A | 10/1997 | Tischler et al. | |
| 5,686,738 A | 11/1997 | Moustakas | |
| 6,156,581 A | 12/2000 | Vaudo et al. | |
| 6,261,931 B1* | 7/2001 | Keller et al. ................. | 438/492 |
| 6,273,948 B1 | 8/2001 | Porowski et al. | |
| 6,407,409 B2* | 6/2002 | Cho et al. ..................... | 257/78 |
| 6,440,823 B1 | 8/2002 | Vaudo et al. | |
| 6,447,604 B1 | 9/2002 | Flynn et al. | |
| 6,488,767 B1 | 12/2002 | Xu et al. | |
| 6,533,874 B1 | 3/2003 | Vaudo et al. | |
| 6,544,867 B1 | 4/2003 | Webb et al. | |
| 6,596,079 B1 | 7/2003 | Vaudo et al. | |
| 6,692,568 B2* | 2/2004 | Cuomo et al. ................. | 117/84 |
| 6,777,315 B1* | 8/2004 | Van Nostrand ............. | 438/478 |
| 2001/0008656 A1 | 7/2001 | Tischler et al. | |
| 2001/0055660 A1 | 12/2001 | Tischler et al. | |
| 2002/0028314 A1 | 3/2002 | Tischler et al. | |
| 2002/0068201 A1 | 6/2002 | Vaudo et al. | |
| 2002/0096692 A1 | 7/2002 | Nakamura et al. .......... | 257/194 |
| 2002/0155634 A1* | 10/2002 | D'Evelyn et al. ............. | 438/48 |
| 2002/0192507 A1* | 12/2002 | Dwilinski et al. .......... | 428/698 |

OTHER PUBLICATIONS

H.P. Maruska et al., "Development of 50MM Diameter Non-Polar Gallium Nitride Substrates For Device Application", 2003 International Conference on Indium Phosphide & Related Materials; May 16, 2003, pp. 567-570.*

(Continued)

*Primary Examiner*—W. David Coleman
(74) *Attorney, Agent, or Firm*—Vincent K. Gustafson; Intellectual Property/Technology Law

(57) ABSTRACT

Large-area, single crystal semi-insulating gallium nitride that is usefully employed to form substrates for fabricating GaN devices for electronic and/or optoelectronic applications. The large-area, semi-insulating gallium nitride is readily formed by doping the growing gallium nitride material during growth thereof with a deep acceptor dopant species, e.g., Mn, Fe, Co, Ni, Cu, etc., to compensate donor species in the gallium nitride, and impart semi-insulating character to the gallium nitride.

112 Claims, 3 Drawing Sheets

OTHER PUBLICATIONS

R. P. Vaudo et al., "GaN Boule Growth" A Pathway to GaN Wafers with Improved Material Quality, Physica Status Solidi (a), Published Online Dec. 10, 2002, pp. 494-497.*

Kelly et al., "Large Free-Standing GaN Substrates by Hydride Vapor Phase Epitaxy and Laser-Induced Liftoff", Japanese Journal of Applied Physics, Part 2, No. 3A, Mar. 1999, pp. L217-L219.*

Valudo et al., "Characteristics of semi-insulating, Fe-doped GaN substrates", Physics Solid State (a), Wiley-VCH Verlag GmbH & Co. KGaA, Weinheim, (Nov. 2003), No. 1, vol. 200, pp. 18-21.*

Jerzy M. Langer, et al. "Transition-metal impurities in semiconductor and heterojunction band lineups", Physical Review B, vol. 38, No. 11, pp. 7723-7739, Oct. 15, 1988.

T. Graf, et al., "The $Mn^{3+/2+}$ acceptor level in group III nitrides", Applied Physics Letters, vol. 81, No. 27, pp. 5159-5161, Dec. 30, 2002.

Sten Heikman, et al., "Growth of Fe doped semi-insulating GaN by metalorganic chemical vapor deposition", Applied Physics Letter, vol. 81, No. 3, pp. 439-441, Jul. 15, 2002.

H. Akinaga, et al., "Growth and characterization of low-temperature grown GaN with high Fe doping", Applied Physics Letters, vol. 77, No. 26, pp. 4377-4379, Dec. 25, 2000.

H. Ofuchi, et al., "Fluorescence x-ray absorption fine structure study on local structures around Fe atoms heavily doped in GaN by low-temperature molecular-beam epitaxy", Applied Physics Letters, vol. 78, No. 17, pp. 2470-2472, Apr. 23, 2001.

U. Wahl, et al., "Direct evidence for implanted Fe on substitutional Ga sites in GaN", Applied Physics Letters, vol. 78, No. 21, pp. 3217-3219, May 21, 2001.

J. Baur, et al., "Photoluminescence of residual transition metal impurities in GaN", Appl. Phys. Lett., 67, (8), pp. 1140-1142, Aug. 21, 1995.

R. Heitz, et al., "Zeeman spectroscopy of the $Fe^{3+}$ center in GaN", Appl. Phys. Lett. 67 (19), pp. 2822-2824, Nov. 6, 1995.

J. Baur, et al., "Infrared luminescence of residual iron deep level acceptors in gallium nitride (GaN) epitaxial layers", Appl. Phys. Lett. 64(7), pp. 857-859, Feb. 14, 1994.

R.Y. Korotkov, et al., "Optical properties of the deep Mn acceptor in GaN:Mn", Applied Physics Letters, vol. 80, No. 10, pp. 1731-1733, Mar. 11, 2002.

J.B. Webb, et al., "Semi-insulating C-doped GaN and high-mobility AlGaN/GaN heterostructures grown by ammonia molecular beam epitaxy", Applied Physics Letters, vol. 75, No. 7, pp. 953-955, Aug. 16, 1999.

N.I. Kuznetsov, et al., "Insulating GaN:Zn layers grown by hydride vapor phase epitaxy on SiC substrates", Applied Physics Letters, vol. 75, No. 20, pp. 3138-3140.

J. Baur, et al., "Determination of the GaN/AlN band offset via the (-/0) acceptor level of iron", Appl. Phys. Lett. 65(17), pp. 2211-2213, Oct. 24, 1994.

R. Heitz, et al., "Excited states of $Fe^{3+}$ in GaN", Physical Review B, vol. 55, No. 7, pp. 4382-4387, Feb. 15, 1997.

Rexhchikov, Michael A., et al., Luminescence properties of defects in GaN, J. Appl. Phys., Mar. 15, 2005, vol. 97, No. 6.

* cited by examiner

SEMI-INSULATING GAN AND METHOD OF MAKING THE SAME

GOVERNMENT RIGHTS IN INVENTION

Work relevant to the subject matter hereof was conducted in the performance of DARPA Contract No. N00014-02-C-0321. The government may have certain rights in the invention hereof.

BACKGROUND OF THE INVENTION

1. Field of the Invention

This invention relates to semi-insulating GaN, and to methods of making same. The semi-insulating GaN material of the invention is useful, inter alia, as a substrate for the manufacture of electronic and/or optoelectronic devices.

2. Description of the Related Art

Gallium nitride and related III–V alloys have exhibited great potential for high temperature and high-frequency electronic applications. However, due to a lack of large area native GaN substrates, most GaN devices have been grown on non-native (heteroepitaxial) substrates such as sapphire and silicon carbide. The use of such foreign substrates is problematic due to lattice mismatch and TE (thermal expansion) mismatch between GaN and the substrate material. One consequence of TE mismatch is bowing of the GaN/heteroepitaxial substrate structure, which leads in turn to cracking and difficulty in fabricating devices with small feature sizes.

Conductive GaN substrates have recently become available (e.g., the conductive GaN substrates that are commercially available from ATMI, Inc., Danbury, Conn. 06810, USA). Such GaN conductive substrates are advantageously employed in applications where the substrate must be conductive and homoepitaxial in relation to associated device structure of GaN. However, in a number of electronic applications such as high frequency electronic applications, a semi-insulating GaN substrate is highly desirable.

U.S. Pat. No. 6,273,948 issued to Porowski et al describes a method of fabricating highly resistive GaN bulk crystals, by crystallization from a solution of atomic nitrogen in a molten mixture of gallium and Group II metal such as beryllium or calcium, under high pressure of 0.5–2.0 GPa and high temperature of 1300–1700° C. Resistivity of $1\times10^4$ to $1\times10^8$ ohm-centimeter (ohm-cm) was achieved. However, the crystal obtained from the process was about 1 cm in size, whereas most commercial electronic applications require a substrate size of at least about 2 inches (>5 cm) diameter.

U.S. Pat. No. 5,686,738 (Moustakas), U.S. Pat. No. 6,544,867 (Webb et al.), U.S. Pat. No. 6,261,931 (Keller et al.), and U.S. patent application Ser. No. 2002/0096692 A1 (Nakamura et al.), disclose various methods of making semi-insulating GaN films on a foreign substrate. All of these approaches are susceptible to TE mismatch issues, and the resultant bowing, cracking and small feature fabrication difficulties discussed above, and none of such approaches has yielded a commercially viable large-area single-crystal semi-insulating gallium nitride material.

There is accordingly a compelling need in the art for large-area semi-insulating GaN substrates.

SUMMARY OF INVENTION

The present invention generally relates to gallium nitride and methods of making same.

In one aspect, the invention relates to large-area single crystal semi-insulating gallium nitride.

In another aspect, the invention relates to a method of forming large area, semi-insulating gallium nitride, comprising growing gallium nitride material by a growth process, and during the growth process, doping the growing gallium nitride with a dopant species that is effective to compensate residual donor species in the gallium nitride, wherein the concentration of the dopant species is sufficient to render the gallium nitride semi-insulating.

A further aspect of the invention relates to a method of forming large area, semi-insulating gallium nitride, comprising growing gallium nitride material by a growth process in which donor species in the growing gallium nitride are compensated, by introducing into the growing gallium nitride one or more deep acceptor species in a sufficient amount to compensate the donor species and produce semi-insulating GaN material.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
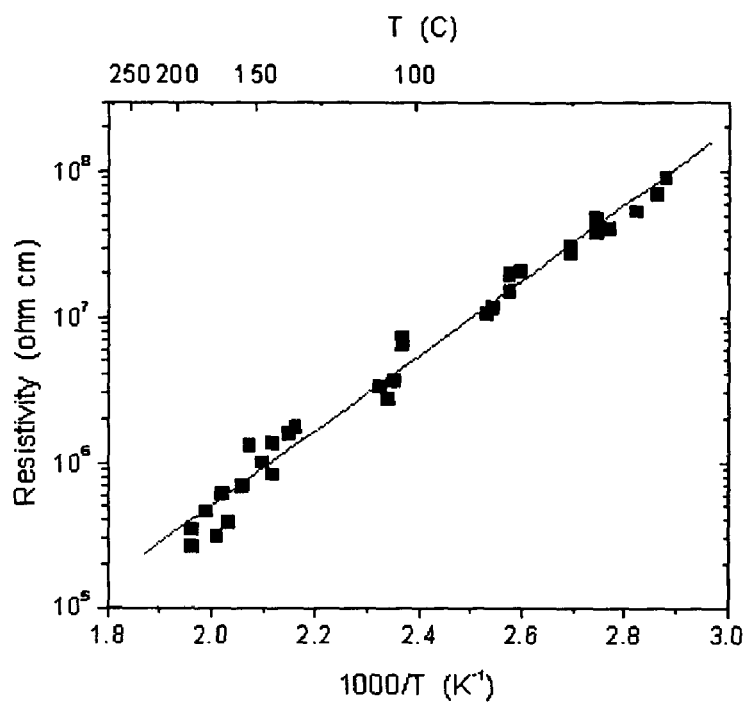
FIG. 1 is a graph of resistivity as a function of inverse temperature for an iron-doped GaN crystal grown in accordance with Example 2 hereof.

The disclosures of the following patents and patent applications are hereby incorporated herein by reference, in their respective entireties:

U.S. Pat. No. 5,679,152 issued Oct. 21, 1997 for "Method of Making a Single Crystal Ga*N Article;"

U.S. Pat. No. 6,156,581 issued Dec. 5, 2000 for "GaN-Based Devices Using (Ga, Al, In)N Base Layers;"

U.S. Pat. No. 6,440,823 issued Aug. 27, 2002 for "Low Defect Density (Ga, Al, In)N and HVPE Process for Making Same;"

U.S. Pat. No. 6,447,604 issued Sep. 10, 2002 for "Method for Achieving Improved Epitaxy Quality (Surface Texture and Defect Density) on Free-Standing (Aluminum, Indium, Gallium) Nitride ((Al, In, Ga)N) Substrates for Opto-Electronic and Electronic Devices;"

U.S. Pat. No. 6,488,767 issued Dec. 3, 2002 for "High Surface Quality GaN Wafer and Method of Fabricating Same;"

U.S. Pat. No. 6,533,874 issued Mar. 18, 2003 for "GaN-Based Devices Using Thick (Ga, Al, In)N Base Layers;"

U.S. patent application Publication No. 2001/0008656 published Jul. 19, 2001 for "Bulk Single Crystal Gallium Nitride and Method of Making Same;"

U.S. patent application Publication No. 2001/0055660 published Dec. 27, 2001 for "Bulk Single Crystal Gallium Nitride and Method of Making Same;"

U.S. patent Application Publication No. 2002/0028314 published Mar. 7, 2002 for "Bulk Single Crystal Gallium Nitride and Method of Making Same;"

U.S. patent application Publication No. 2002/0068201 published Jun. 6, 2002 for "Free-Standing (Al, In, Ga)N and Parting Method for Forming Same;" and U.S. patent application Ser. No. 09/524,062 filed on Mar. 13, 2000 in the names of Robert P. Vaudo, et al.

The present invention is based on the use of III–V nitride deposition to form large-area semi-insulating substrates. While illustratively described hereinafter in reference to GaN as the III–V nitride material of particular interest, it will be recognized that the invention is not thus limited, but rather extends to and encompasses other III–V nitride species, e.g., (Ga,Al,In)N materials.

As used in such context, "(Ga,Al,In)N" refers to metal nitride compositions in which the metal moiety can be one, two or all three of such gallium, aluminum and indium metals in appropriate stoichiometric ratio, e.g., GaN, AlN, InN, GaAlN, GaInN, AlInN, or GaAlInN. The stoichiometric proportions of the metals in multi-metal III–V nitride compounds will be understood to encompass integer as well as non-integer values. For example, it is understood that the term GaAlN refers to $Ga_xAl_{1-x}N$ where $0 \leq x \leq 1$. Accordingly, the disclosure hereinafter directed to a "GaN material" or a "GaN process" will be understood to have broad application to such other III–V nitride compositions and their methods of formation.

As used herein, the term "large area" in reference to the GaN material means that such material has a diameter of at least 25 millimeters, or in the case of square or rectangular wafers, a diagonal dimension of at least 25 mm. The thickness dimension desirably is at least 300 micrometers, e.g., a thickness in a range of from about 300 micrometers to about 5 centimeters or more. These dimensions are in reference to the wafers as formed from the original crystal growth single wafers or from boules by steps including initial crystal growth to form the boule or ingot article, followed by rounding, sizing, slicing, lapping, polishing, etc. as necessary to produce wafers having surfaces suitable for epitaxial growth thereon.

As used herein, the term "free-standing" in reference to the semi-insulating GaN of the present invention means a three-dimensional body of such semi-insulating GaN material that is not physically affixed to or integral with any substrate, i.e., the semi-insulating GaN is a stand-alone article.

As used herein, the term "semi-insulating" in reference to the semi-insulating GaN material of the invention means that such material has a resistivity >100 ohm-centimeters (Ω-cm) at room temperature (~25° C.). In one embodiment, the GaN material of the invention may have a resistivity $>10^2$ Ω-cm at 200° C. In another embodiment, the semi-insulating GaN material may have a resistivity $>10^5$ Ω-cm at room temperature. More preferably, the semi-insulating GaN material has a resistivity $>10^5$ Ω-cm at 200° C., and most preferably the semi-insulating GaN material has a resistivity $>10^5$ Ω-cm at 300° C. Such values of resistivity are determined by four point probing techniques (van der Pauw contact geometry) as a function of temperature. In instances where the GaN material, e.g., as a free-standing substrate article, has microelectronic circuitry fabricated on and/or within such substrate, the GaN material of the invention has a semi-insulating character in the operating temperature regime of such microelectronic circuitry. The term "within" in such context refers to circuitry in which the substrate forms a part of the device, e.g., wherein the substrate is subjected to an implantation process to form implanted device region(s) in the substrate.

The GaN process used to grow the semi-insulating GaN of the invention may be of any suitable type. While the invention is described primarily hereinafter in specific reference to hydride vapor phase epitaxy (HVPE), it will be recognized that the invention is not thus limited, and that the semi-insulating GaN of the invention can be formed by other growth methods, including iodine vapor phase growth (IVPG), metalorganic chemical vapor deposition (MOCVD), halide vapor phase epitaxy (HaVPE), mechanical sputter epitaxy (MSE), molecular beam epitaxy (MBE) and nitrogen ion cluster epitaxy (NICE).

In accordance with the present invention, large area, semi-insulating gallium nitride is produced by a growth process in which donor species in the growing gallium nitride are compensated, by introducing into the growing gallium nitride one or more deep acceptor species in a sufficient amount to compensate the donor species and yield a gallium nitride of semi-insulating character.

The donor species in the grown gallium nitride may derive from defects in the material that are ionized to produce ionized centers and free conductive band electrons. GaN growth processes invariably produce native defects and incorporate unintentionally doped impurities in the grown GaN material, producing an n-type conductivity GaN product. The unintentionally doped impurities can for example include residual donor ions deriving from impurities in the reaction chamber in which the GaN is grown, e.g., as present in the walls of a quartz growth chamber. These impurities function to lower the resistivity of the GaN material produced in the growth process. For example, HVPE processes produce GaN material having an electron concentration that is typically near $1 \times 10^{16}$ cm$^{-3}$ or greater.

In accordance with the present invention, large-area, semi-insulating GaN material is produced by intentional doping of deep acceptor species in the gallium nitride material during growth thereof, to compensate the donor species deriving from defects and residual incorporated impurities of the grown material.

The deep acceptor species can be of any suitable type that is compensatingly effective to produce a GaN material that is semi-insulating in character. The deep acceptor species can include one deep acceptor species or more than one such species. In accordance with a preferred aspect of the invention, the deep acceptor species comprises one or more transition metals.

The transition metals useful in the invention can be of any suitable type or types, e.g., scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium.

The deep acceptor dopants employed in the practice of the invention accept electrons having an energy level intermediate the valence band and the conduction band of the GaN, e.g., as generated by unintentionally doped impurities or native defects in the material, thereby making the gallium nitride semiconductor into a semi-insulating material.

The use of deep acceptor dopants in HVPE formation of gallium nitride is carried out in a preferred embodiment of the invention to achieve growth of semi-insulating gallium nitride at high rate and produce thick, large-area GaN material.

The energy level of the acceptor species is important in determining the conductivity or resistivity of the GaN material at high temperatures. If the activation energy is too small, trapped donor impurities can become thermally activated at high operating temperatures, with the result that the GaN material is more conductive under such conditions. Activation energy of the deep acceptor species useful in the broad practice of the invention is preferably greater than 0.35 electron volt (eV), more preferably greater than 0.5 eV and most preferably greater than 0.75 eV.

In accordance with a preferred aspect of the invention, at least one transition metal selected from the group of Cr, Mo, W, Mn, Re, Fe, Ru, Os, Co, Rh, Ir, Ni, Pd, Pt, Cu, Ag, Au, Zn, Cd and Hg is employed as a deep level acceptor for forming large-area semi-insulating gallium nitride. Particularly preferred dopant species include Mn, Fe, Co, Ni, and Cu, with Fe being presently most preferred.

The present invention contemplates large-area free-standing semi-insulating gallium nitride produced by incorporating one or more deep acceptor species during growth. Gallium nitride substrate material in a preferred aspect of the invention is grown using an HVPE process, in which a transition metal is introduced into the growth environment, e.g., into the HVPE growth chamber (reactor), as hereinafter more fully described. For such purpose, the reactor preferably is configured to minimize unintentional impurities in the growth environment. It is generally preferred to maintain unintentional impurities in the grown GaN at a level less than $5 \times 10^{17}$ cm$^{-3}$, more preferably less than $1 \times 10^{17}$ cm$^{-3}$, even more preferably less than $5 \times 10^{16}$ cm$^{-3}$, and most preferably less than $1 \times 10^{16}$ cm$^{-3}$.

Transition metals can be incorporated into the GaN crystal by using one or more corresponding metal source reagents in the gallium nitride growth process.

When HVPE is utilized as the gallium nitride growth process, the GaN growth can be carried out by contacting hydrochloric acid (HCl) with metallic gallium. The metallic gallium can be provided in a reservoir (boat), and the contacting with HCl forms gaseous GaCl, which is carried to the growth zone and reacted with NH$_3$ to form crystalline GaN, e.g., on a GaN seed crystal or other growth substrate. In accordance with the invention, the deep acceptor species is introduced to the growth zone, so that deep acceptor species is incorporated in the growing GaN crystal in an amount effective to compensate the donor species in the GaN crystal and render it semi-insulating, e.g., as having a resistivity greater than $10^5$ Ω-cm at 25° C. and at 300° C.

HVPE processes for forming semi-insulating GaN can be carried out in any suitable manner, such as by adaptation (by doping the growing GaN crystal with a deep acceptor species) of the HVPE process described in U.S. Pat. No. 6,440,823 issued Aug. 27, 2002 in the names of Robert P. Vaudo, et al. for "Low Defect Density (Al, In, Ga)N and HVPE Process for Making Same," or other HVPE processes that are disclosed in the various patents and patent applications identified and incorporated by reference hereinabove.

In general, GaN growth process in accordance with the invention are desirably carried out with minimization of the "background" impurities in the GaN material deriving from the growth chamber, raw materials for the GaN manufacturing process, or other components or materials of the process system. The process conditions (e.g., temperature, pressure, concentrations, V/III ratio, etc.), gas purity, and reactor construction (including materials of construction and configuration) should in general be optimized to minimize such background impurity concentrations, so that background carrier concentrations are maintained at suitably low levels, e.g., less than $5 \times 10^{17}$ cm$^{-3}$, and more preferably less than $1 \times 10^{16}$ cm$^{-3}$, or lower. The background carrier concentration comprises native defects and impurities that contribute to conduction in the material.

As an illustrative example, the HVPE process can be carried out to grow the GaN material, using NH$_3$, HCl and Ga as reactants, in which the growth process is carried out at a suitable process conditions, e.g., a temperature in a range of from about 985° C. to about 1010° C., a growth rate of from about 50 to about 150 µm per hour, a pressure of from about 10 to about 800 torr, and a NH$_3$/HCl ratio of from about 2 to about 40, e.g., about 5, to produce a GaN material of suitable low defect density character, e.g., having a dislocation defect density that is not in excess of $1 \times 10^7$ defects/cm$^2$, and more preferably not in excess of $1 \times 10^6$ defects/cm$^2$.

In another illustrative example, the growth of GaN can be carried out in a two-stage growth procedure, including (1) a first stage in which the GaN material is grown on a substrate at a temperature in a range of from about 950° C. to about 1020° C. to form GaN material having a dislocation density of $10^7$ defects/cm$^2$ or lower, with the GaN material having pits on an upper surface of the material at the conclusion of such first stage of the process, and (2) a second stage in which GaN material is grown on the first stage GaN material, at a temperature in a range of from about 1020° C. to about 1250° C. for sufficient time to at least partially fill the pits formed on the surface of the GaN material in the first stage of the process.

The deep acceptor doping is carried out during both stages of the process. Such a two-stage process is beneficial since the second stage processing reduces background carrier concentration, making it easier to produce semi-insulating GaN material.

Particularly preferred process conditions in the first stage of such two-stage HVPE process include temperature in a range of from about 985° C. to about 1010° C., growth rate in a range of from about 50 to about 150 µm of GaN per hour, pressure in a range of from about 10 to about 800 torr, and the reactants NH$_3$ and HCl being in a ratio NH$_3$/HCl that is in a range of from about 2 to about 40, e.g., from about 2 to about 10.

The GaN material as a further example can be formed by a vapor phase epitaxy process to form a semi-insulating GaN boule, by growing the GaN material on a native GaN seed crystal, or alternatively on a heteroepitaxial substrate (that is removed in situ or ex situ from the resultant GaN boule), at a growth rate that is above 20 micrometers per hour, and preferably above 50 micrometers per hour, with introduction of the deep acceptor dopant into the growing GaN film at a concentration producing semi-insulating GaN material.

The boule produced by such process can for example have a diameter greater than 25 millimeters, and a length (thickness of the boule in the growth direction) that is at least 1 centimeter, having a crystal quality that yields a double crystal x-ray rocking curve full width half maximum value of less than 250 arcseconds, and a top surface defect density of less than $10^4$ defects cm$^{-2}$.

A wide variety of HVPE and other GaN growth processes can be utilized in the broad practice of the present invention, wherein the transition metal doping of the GaN material is carried out during the growth process, to form semi-insulating GaN. In general, HVPE processes are carried out, with deep acceptor doping, at a high growth rate, e.g., on the order of from about 50 to about 250 micrometers per hour, at growth temperatures of from about 950 to about 1150° C., pressures of from about 25 to about 760 torr, and V/III ratio of from about 2 to about 50, more preferably from about 2 to about 40, and most preferably from about 5 to about 40, to form the semi-insulating GaN at a suitable thickness, e.g., of from about 50 micrometers to about 5 centimeters or more.

The deep acceptor doping of the GaN material during the growth process can be carried out in any suitable manner, as for example in accordance with the illustrative embodiments described below.

When HVPE is utilized as the gallium nitride growth process, the deep acceptor dopant can be passed to the growth chamber in a carrier gas, e.g., when the deep acceptor component is of vapor form. If the deep acceptor species is a liquid or solid having sufficient vapor pressure, bubbler or vaporizer arrangements can be employed in which the carrier gas is contacted with and entrains the deep acceptor vapor. Alternatively, the deep acceptor species may be delivered to the growth zone as a component of a source reagent, e.g., a deep acceptor transition metal constituting the metal moiety of an organometal compound, which is in vapor form, or is volatilizable by bubbler, vaporizer or the like, for delivery to the growth chamber.

The deep acceptor species thus can be in any suitable form in which it can be delivered to the growth chamber. The deep acceptor species may likewise be incorporated in, or reacted with, one or more of the raw materials (e.g., Ga, HCl, GaCl, $NH_3$) that are introduced to, or produced in, the GaN process system. When the deep acceptor is introduced in a precursor form, e.g., in a metalorganic precursor whose metal moiety is the deep acceptor species, the precursor desirably is (i) sufficiently volatile to enable good transport to the growth chamber, (ii) readily decomposable to yield the deep acceptor species for incorporation in the growing GaN material, or (iii) alternatively reactive or otherwise transformable to effectively incorporate the deep acceptor species in the growing GaN material, and (iv) of sufficient purity so as not to introduce undesirable impurities into the growing GaN material.

Precursor flow to the growth chamber can be constant, varied, or switched on and off, depending on desired outcome. In most instances, precursor flow will be maintained constant during the incorporation of the deep acceptor in the growing GaN material.

In one illustrative embodiment of the invention, a transition metal deep acceptor species is mixed with the gallium source forming a solution of the transition metal in gallium. In this arrangement, the HVPE GaN growth reactor apparatus can be maintained in a conventional process configuration, without modification. The transition metal is loaded with gallium into the gallium reservoir, and the HVPE process then is carried out, with the transition metal being incorporated as a dopant in the GaN product material.

In some applications, this approach may be less preferred than others described hereinafter, since the other approaches enable the amount of transition metal incorporated in the GaN crystal to be modified during the growth process. Recharging of the gallium and the transition metal are required by this approach, in order to adjust the transition metal concentration, or to maintain the transition metal concentration if the consumption rates (of the gallium and transition metal) differ. The amount of transition metal incorporation may be varied with the process history since there may be a preferential reaction with HCl so that the transition metal concentration in gallium varies with time. The advantage of this approach is the simplicity of the process, which can be carried out in an existing HVPE GaN reactor without any hardware modification.

In another embodiment, the transition metal dopant is placed in a separate boat inside the reactor or in an external source vessel, and HCl is flowed over the transition metal boat, thereby converting transition metal into gaseous metal chloride that is carried to the growth zone by the carrier gas. The concentration of the gaseous transition metal chloride can be adjusted by regulating the HCl flow and the boat temperature to achieve a specific metal chloride concentration appropriate to the specific semi-insulating GaN growth process.

In yet another embodiment, transition metal chloride is placed in a separate boat inside the reactor or in an external source vessel, and carrier gas is used to carry the metal chloride vapor to the growth zone. The concentration of the metal chloride vapor can be controlled by adjusting boat/source vessel temperature and carrier gas flow rate as appropriate to the compensating level of the deep acceptor dopant necessary to form the semi-insulating GaN material. The requisite doping concentration of the deep acceptor species for imparting semi-insulating character to the GaN material is readily determinable by simple empirical variation of dopant concentration in successive runs, followed by the characterization of the material produced in each run, by four point probe determination, to determine the concentration best suited to a specific set of process conditions.

The same approach can be utilized for empirical determination of appropriate process variables and/or reactor configuration and material(s) of construction, since all of these factors can impact the GaN growth process and the nature and extent of compensation of the donor species present in the GaN material.

Thus, the vapor-phase epitaxial growth process can utilize metal chloride as a gaseous dopant source material that is introduced to the growth zone. This approach requires the use of a transition metal chloride having sufficiently high vapor pressures, and therefore is limited to transition metals with higher metal chloride vapor pressures such as iron. Suitable transition metals can be identified for such approach by measurement of the vapor pressure of the candidate metal chloride compounds, to determine a transition metal chloride compound appropriate to a given application of the GaN growth process.

In another variant approach, a volatile metal-organic compound can be used as a deep acceptor source reagent, e.g., for a deep acceptor transition metal. Volatile metal-organic compounds useful for such application include, without limitation, cyclopentadienyl transition metal compounds, such as $Cp_2Fe$ (bis(cyclopentadienyl)iron, also termed ferrocene), $Cp_2Mn$, $Cp_2Co$, $Cp_2Ni$, $Cp_2Cr$, deep acceptor metal compounds such as metal carbonyls, metal carbonyl derivatives, metal pentanedionates, metal acetylacetonates, and other aliphatic and aromatic deep acceptor metal source compounds of sufficiently vaporizable or volatilizable character for delivery to the growth chamber, using delivery techniques such as flash vaporization, bubbler delivery, sublimation, aerosolization, ultrasonic dispersion, etc.

For example, compounds such as the illustrative cyclopentadienyl compounds discussed above may be delivered to the growth chamber by bubbler delivery techniques, in which the deep acceptor metal cyclopentadienyl compound is a solid at room temperature (~25° C.), and has sufficient vapor pressure for use in a bubbler-based vapor feed arrangement. The metal cyclopentadienyl compound is placed in a bubbler outside the main reactor vessel, and carrier gas is passed through the bubbler to entrain the metal-organic vapor and transport it to the growth zone in the reactor chamber. By such bubbler delivery, the concentration of the metal impurity in the GaN crystal can be controlled by the temperature in the bubbler chamber and the carrier gas flow rate, each of which can be independently varied to achieve a specific incorporation of the metal deriving from the metal cyclopentadienyl compound.

In other embodiments of the invention, the deep acceptor agent can be of any suitable phase (gas, liquid or solid) as appropriate for processing and subsequent incorporation in the growing GaN film to impart semi-insulating character thereto.

Semi-insulative GaN substrates can be formed in accordance with the invention in a process in which the semi-insulating GaN material is grown on a sapphire, SiC or other suitable heteroepitaxial substrate, following which the semi-insulating GaN material is separated from the heteroepitaxial substrate by a suitable separation process. Such separation of the semi-insulating GaN material from the heteroepitaxial substrate can for example be carried out by in situ removal of the heteroepitaxial substrate at or in the vicinity of the semi-insulating GaN growth temperature, as described more fully in U.S. Pat. No. 5,679,152 issued Oct. 21, 1997 for "Method of Making a Single Crystal Ga*N Article," the disclosure of which is hereby incorporated herein by reference. As further alternatives, parting or separating the semi-insulating GaN material from the heteroepitaxial substrate material can be effected using parting layers, thermal fracturing techniques, energy impingement on the GaN/heteroepitaxial substrate interface, or in other suitable manner, as more fully disclosed in various of the patents and patent applications identified and incorporated by reference hereinabove.

As yet another alternative approach, the semi-insulating GaN material of the invention can be grown on a GaN seed, e.g., formed as more fully disclosed in the various patents and patent applications identified and incorporated by reference hereinabove. Such GaN seed can be semi-insulating in character, or the semi-insulating material can be grown on a conductive seed that is subsequently removed (e.g., by polishing, slicing or other removal technique).

The semi-insulating bulk GaN material of the invention can be formed by vapor deposition techniques such as HVPE, or in other manner, at any suitable thickness and size characteristics. For example, semi-insulating GaN substrates can be formed at thickness in a range of about 300 micrometers to about 5 centimeters, to yield a single wafer, ingot, boule, or other bulk material body, having appropriate dimensions. For example, HVPE methods of the invention can be carried out to yield semi-insulating GaN boules having a diameter on the order of about 50–100 millimeters, at thicknesses of 1.25 cm and greater.

The bulk material body of the single crystal semi-insulating GaN, once formed, is processed to yield wafer blanks, e.g., by sawing or other technique. The wafer blanks in turn are subjected to lapping, polishing and planarization operations, as necessary, to produce wafers of suitable thickness for use in forming electronic and/or optoelectronic device structure(s) thereon.

The gallium nitride material may thus be utilized as a semi-insulating substrate for fabrication of an electronic device thereon and/or therewithin. Such electronic device can for example include devices such as a high electron mobility transistor (HEMT), a monolithic microwave integrated circuit (MMIC), etc. Additionally, the gallium nitride material of the invention may be utilized in connection with a conductive substrate, to facilitate device fabrication of microelectronic devices such as high power rectifiers.

The finished wafer preferably has a low level of dislocation defects below about $10^6$ defects $cm^{-2}$, as determinable by AFM or optical microscopy techniques following suitable defect decoration. For example, small pits (visible by AFM) are formed around threading dislocations following the chemical mechanical polishing (CMP) or hot phosphoric acid etching of GaN wafers. Such dislocations are "decorated."

The semi-insulating GaN of the invention is usefully employed for fabricating a wide variety of GaN devices that are currently grown on heteroepitaxial substrate materials such as sapphire or semi-insulating silicon carbide.

The present invention thus provides a methodology for forming semi-insulating GaN in which donor species in the gallium nitride material are compensated during the material growth process by acceptor species. The acceptor species may include dopant deep acceptor species such as Mn, Fe, Co, Ni, Cu, Cr, etc. as well as compensating impurities deriving from the raw materials, growth chamber materials of construction, etc., which function to compensate the donor species and yield semi-insulating GaN material as the product of the growth process. It correspondingly is within the scope of the invention to utilize multiple impurities as compensating acceptor species. It is also within the scope of the invention to use impurity-defect complexes to compensate residual donors in the growing GaN material, in producing semi-insulating GaN bulk forms.

The concentration of the dopant/impurity species that is desirable in the GaN growth process of the invention can be readily determined by measurement of resistivity of the GaN material formed, in samples of GaN that have been formed under otherwise corresponding process conditions, but at differing concentrations of the dopant/impurities, wherein ohmic contacts of suitable material (e.g., InSn alloy contacts) are formed on the respective material samples to enable resistivity testing to be conducted. Elevated temperature measurements may be required to accurately determine the resistivity.

Secondary ion mass spectroscopy (SIMS) can also be employed to measure and tune the background impurity and dopant concentrations.

By way of specific example, iron doping may be effected with concentrations of from about $3 \times 10^{16}$ Fe atoms/$cm^3$ to about $7 \times 10^{16}$ Fe atoms/$cm^3$, as determined by SIMS or GDMS measurement techniques known to those skilled in the art, in combination with donor concentration less than $3 \times 10^{16}$ $cm^{-3}$, to yield semi-insulating GaN having a suitable resistivity value, e.g., ~$2 \times 10^9$ ohm-cm.

The semi-insulating GaN material of the invention has a background carrier concentration that is consistent with the semi-insulating character of the GaN material, and such background carrier concentration is desirably as low as possible. For example, the growth process in the absence of the semi-insulating compensation of the invention may produce a GaN material having a background carrier concentration that is in a range of from about $10^{15}$ to about $10^{18}$ cm$^{-3}$.

Conditions of the growth process can be adjusted as necessary to reduce the background carrier concentration, such as by use of growth times that are sufficiently long to reduce defect density and impurity concentration (e.g., of impurities such as silicon, oxygen, sulfur, carbon, phosphorus, chlorine, etc.) to predetermined or otherwise desired levels, which as mentioned should be as low as possible. Background carrier concentration can also be minimized by appropriate adjustment of process conditions such as III–V ratio, growth temperature, pressure, growth rate, etc. Purification of chemical reagents used in the growth process, or use of ultra-high purity reagents is also advantageous to minimize the background carrier concentration, as is avoidance of growth chamber structural components that can undesirably contribute impurities such as silicon, oxygen, etc.

Consistent with the foregoing, the deep acceptors that are utilized as compensating species in the practice of the invention, and their precursors (when a precursor reagent is employed) are likewise desirably of a high purity character that avoids the undesired introduction of contaminant impurities into the growing gallium nitride material. Additionally, such deep acceptors and precursors are desirably selected to be well-matched to the specific growth process that is utilized to form the semi-insulating GaN material. For example, organometallic precursors employed as sources for transition metal dopant species are advantageously selected to possess sufficient volatility for efficient transport in the growth environment, and to decompose cleanly and efficiently to yield the desired dopant species or otherwise to react or transform in such manner as to efficiently incorporate the deep acceptor species, without introducing undesirable impurities into the growing GaN material.

The features and advantages of the invention are more fully shown by the following illustrative non-limiting examples.

EXAMPLE 1

HVPE GaN Growth Incorporating Multiple Transition Metal Elements

In this example, the efficiency of incorporating transition metals in GaN crystals was determined in an HVPE process.

One weight percent of each of Cu, Ni, Co, Fe, Mn, and Cr, was added together with the others of such metals, in the gallium boat of an HVPE GaN growth system. After the HVPE reactor was heated to the growth conditions, gallium nitride crystals were grown under the same growth conditions as used for HVPE growth of gallium nitride without transition metal impurities.

The growth conditions were: growth temperature=1030° C., growth pressure=50 Torr, and growth rate=~100 µm/hour. The transition metal impurity concentration in the grown GaN crystal was analyzed using glow discharge mass spectrometry (GDMS) by a commercial vendor.

Table I below shows the concentration of impurities in a GaN crystal grown in this example. The concentration of each of Cr, Mn and Co was below the detection limit of the GDMS. The iron concentration was the highest in the GaN film, followed by copper and nickel. This experiment indicated that a mixture of transition metal impurities in the metallic gallium reservoir allowed reasonable incorporation of iron and copper in the crystal during HVPE GaN growth.

TABLE I

Impurity Concentration (parts-per-billion, by weight, based on the weight of the GaN film) Measured by GDMS in a GaN Crystal Grown in Example 1.

| Transition Metal | Conc. (ppb) |
|---|---|
| Cr | <5 |
| Mn | <5 |
| Fe | 40 |
| Co | <1 |
| Ni | 6.5 |
| Cu | 25 |

EXAMPLE 2

Semi-Insulating HVPE GaN Using Low-level Iron Doping

In this example, the growth and properties of semi-insulating HVPE GaN crystals were demonstrated by incorporating low concentration iron impurity. 2.8 grams of 99.995% pure iron and 250 grams of 99.99999% gallium were loaded into the gallium boat (reservoir) at room temperature. The reactor was sealed and the reactor temperature was raised to the growth temperature.

GaN crystals were grown on a sapphire template using the baseline growth conditions. The growth conditions were: growth temperature=1030° C., growth pressure=50 Torr, and growth rate=about 100 µm/hour. After four-hour growth, the GaN crystals were removed from the reactor and characterized.

Table II below shows the impurity concentration in a GaN crystal grown in this example. The impurity concentration was measured with secondary ion mass spectrometry (SIMS) by commercial vendor. The iron concentration was about $4 \times 10^{16}$ Fe atoms cm-3, which was slightly higher than the total donor impurity (silicon, oxygen, and carbon) concentration.

TABLE II

Impurity Concentration Measured by SIMS in a GaN Crystal Grown in Example 2

| Element | Concentration (cm-3) |
|---|---|
| Fe | $4 \times 10^{16}$ |
| C | $7 \times 10^{15}$ |
| Si | $1.5 \times 10^{16}$ |
| O | $2 \times 10^{16}$ |

The resistivity of the GaN crystal grown in Example 2 was measured as a function of temperature by the four-point probe method using InSn contacts. The contacts were ohmic once the InSn had melted and the temperature of the GaN was above ~60° C. FIG. 1 shows resistivity data, as a function of inverse sample temperature, for the iron-doped GaN crystal sample grown by the method described above. The resistivity at 250° C. was $3 \times 10^5$ ohm-cm and the resistivity at room temperature (determined by extrapolation) was $2 \times 10^9$ ohm-cm. The activation energy for Fe-doped GaN was 0.51 eV, as shown in FIG. 1.

EXAMPLE 3

Conductive HVPE GaN Using Low-level Iron Doping but with High Donor Impurities In this example, the importance of reducing the background donor impurity concentration was demonstrated. This example used a different HVPE reactor configuration than the reactor that was used in Example 2.

5 grams of 99.995% pure iron and 800 grams of 99.99999% gallium were loaded into the gallium boat (reservoir) at room temperature (~25° C.). The reactor was sealed and the reactor temperature was raised to the growth temperature. GaN crystals were grown on a sapphire template using the baseline growth conditions. The growth conditions were: growth temperature=1030° C., growth pressure=400 Torr, and growth rate=about 200 µm/hour. Sacrificial growth was carried out prior to the steady state growth process, to let the reactor settle in a stable condition. At start of the steady state growth process, the amount of gallium in the gallium boat was about 600 grams. The amount of iron in the boat was not determined, although the initial iron concentration was 0.6% wt. After three hours of growth, the GaN crystals were removed from the reactor and characterized.

The crystal grown in this example was not semi-insulating. Room temperature Hall measurement showed that the carrier concentration was $6.6 \times 10^{16}$ cm-3 and the carrier mobility was 895 cm$^2$/Vs. The resistivity of the crystal was 0.1 ohm-cm. The impurity concentration was measured by secondary ion mass spectrometry (SIMS). The SIMS determination of iron concentration was $1.9 \times 10^{16}$ cm$^{-3}$, as shown in Table III below. This iron concentration was lower than the total concentration of silicon and oxygen, which accounted for the conductive character of the GaN grown in this example.

TABLE III

Impurity Concentration Measured by SIMS and GDMS in a GaN Crystal Grown in Example 3

| Element | SIMS (cm$^{-3}$) |
| --- | --- |
| Fe | $1.9 \times 10^{16}$ |
| Si | $5.5 \times 10^{15}$ |
| O | $2.2 \times 10^{17}$ |

EXAMPLE 4

HVPE GaN Using High Level Iron Doping

This example involved two samples, each doped with more Fe than Si or O, but with all such dopants being at high concentration in both samples.

This example shows that if the background impurity level is too high, then it is not possible to simply add more deep acceptor to compensate. There is, instead, a background impurity limit (BIL), which we have determined (for iron; the BIL may depend on the specific compensating species employed) to be about $5.0 \times 10^{17}$ cm$^{-3}$, above which concentration the background impurities become non-compensatable by further addition of deep acceptor species to the growing GaN material. For this reason, the GaN background impurities concentration (BIC) should not exceed about $5.0 \times 10^{17}$ cm$^{-3}$. In preferred practice, the BIC is less than $1.0 \times 10^{17}$ cm$^{-3}$, more preferably being less than $5.0 \times 10^{16}$ cm$^{-3}$ and most preferably being less than $1 \times 10^{16}$ cm$^{-3}$.

In this example, 5 grams of 99.995% pure iron and 800 grams of 99.99999% gallium were loaded into the gallium boat (reservoir) at room temperature. The reactor was sealed and the reactor temperature was raised to the growth temperature. GaN crystals were grown on a sapphire template using the baseline growth conditions. The growth conditions were: growth temperature=1030° C., growth pressure=400 Torr, and growth rate=about 200 µm/hour. A short sacrificial growth was performed prior to steady-state growth conditions being established, to let the reactor settle into a stable condition. At the start of steady-state growth, the amount of gallium in the gallium boat was about 750 grams and amount of iron in the boat was about 0.6% wt. After three hours of growth, the GaN crystals were removed from the reactor and characterized.

The impurity concentration was measured by secondary ion mass spectrometry (SIMS) by a commercial vendor. Table IV shows the impurity concentration for the crystal grown in this example.

The concentration of iron in the crystal was about $1.1 \times 10^{19}$ cm$^{-3}$, much higher than the concentration of silicon ($1.0 \times 10^{17}$ cm$^{-3}$) and the concentration of oxygen ($4.7 \times 10^{17}$ cm$^{-3}$) combined. However, room temperature Hall measurement showed that the crystal was not semi-insulating. The room temperature resistivity for the crystal was 16 ohm-cm, the carrier concentration was $5 \times 10^{15}$ cm$^{-3}$ and the carrier mobility was 68 cm$^2$/Vs. This suggested that iron at high concentration did not completely compensate the donor impurity.

TABLE IV

Impurity Concentration Measured by SIMS in the GaN Crystal Grown in Example 4

| Element | SIMS (cm$^{-3}$) |
| --- | --- |
| Fe | $1.1 \times 10^{19}$ |
| Si | $1.0 \times 10^{17}$ |
| O | $4.7 \times 10^{17}$ |

Figure 2:
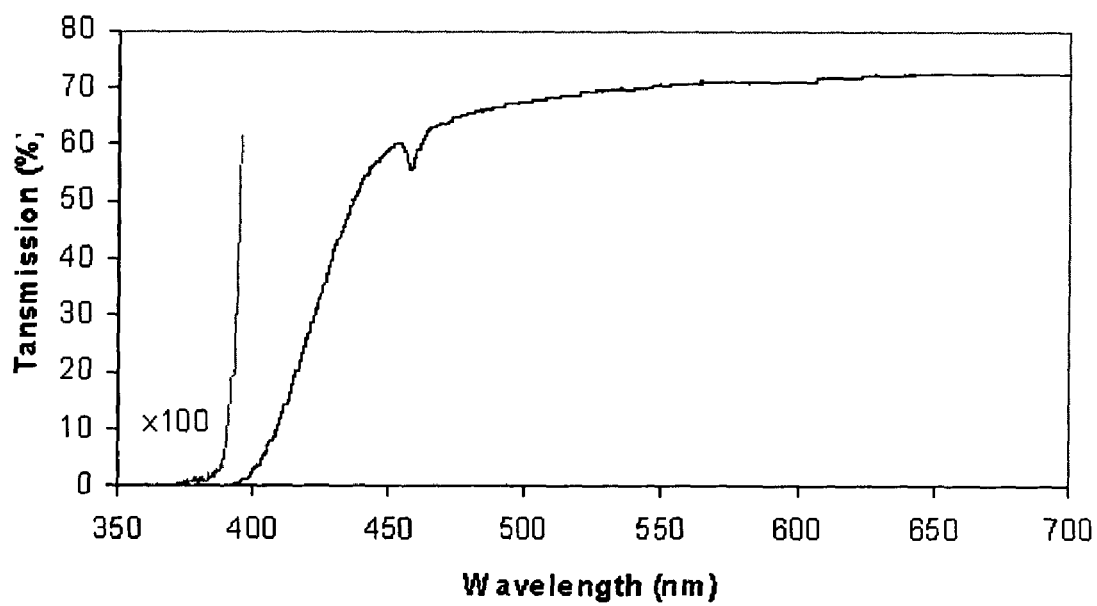
FIG. 2 is a UV-VIS transmission spectrum for a crystal grown in accordance with Example 4 hereof. The crystal is double side polished, 384 um thick, iron concentration $1.1\times10^{19}$ cm-3, silicon concentration $1.0\times10^{17}$ cm-3, oxygen concentration $4.7\times10^{17}$ cm-3.

FIG. 2 shows the UV-VIS transmission spectrum for a crystal grown in this example. The crystal was double side polished, 384 µm thick, with an iron concentration of $1.1 \times 1019$ cm$^3$, a silicon concentration of $1.0 \times 10^{17}$ cm$^{-3}$ and an oxygen concentration $4.7 \times 10^{17}$ cm$^{-3}$.

Figure 3:
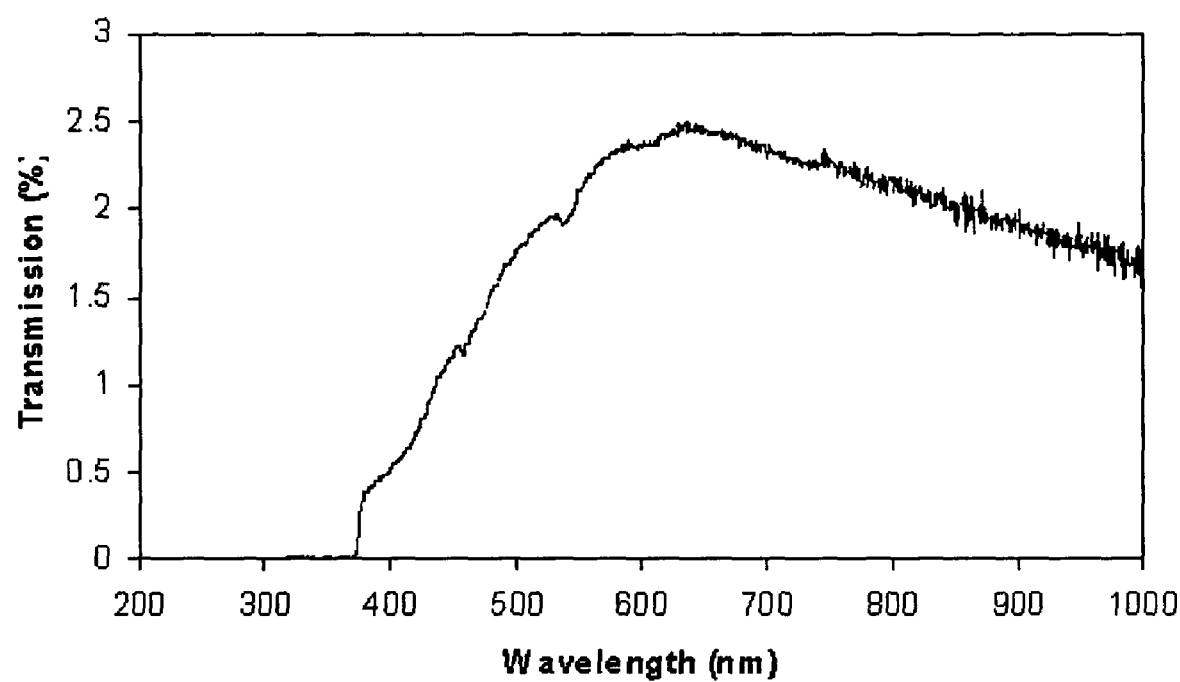
FIG. 3 is a UV-VIS transmission spectrum for a heavily iron-doped, single side polished, 200 μm thick with iron concentration of $3\times10^{19}$ cm-3 and donor impurities silicon of $7.5\times10^{17}$ cm-3 and oxygen of $4.9\times10^{16}$ cm-3.

FIG. 3 shows the UV-VIS spectrum for another crystal (single side polished, 200 microns thickness) that was grown with higher iron concentration in the gallium boat, producing a heavily iron-doped crystal with iron concentration of $3 \times 10^{19}$ cm$^{-3}$. The donor impurities were silicon, at a concentration of $7.5 \times 10^{17}$ cm$^{-3}$, and oxygen, at a concentration of $4.9 \times 10^{16}$ cm$^{-3}$. The crystal was conductive with resistivity of 0.012 ohm-cm, carrier concentration of $1.2 \times 10^{19}$ cm$^{-3}$ and mobility of 35 cm$^2$/Vs.

Both crystals exhibited n-type conduction. The UV-VIS spectra show a relatively sharp absorption peak at 456.7 nm (2.71 eV), which was attributed to the intracenter transition of Fe$^{3+}$ impurity in the 6A1(s) ground state to the 4E(G) excited state. The broad band absorption at the wavelength below 450 nm was attributed to excitation of the Fe$^{3+}$6A1(S) ground state to bounded electron-hole pair (Fe$^{3+}$). This broad absorption leveled off at about 390 nm (3.18 eV), indicating that the energy level of the Fe$^{3+}$/Fe$^{2+}$ charge transfer was about 3.18 eV above the valence band. The origin of n-type conduction in the heavily iron-doped HVPE GaN crystal was not rigorously determinable, but may have been related to the generation of crystal defects attributable to the high iron concentration. Nonetheless, this example shows that the achievement of semi-insulating GaN is not simply a matter of loading the film with high amounts of the deep acceptor dopant species when background impurities are high in concentration. Instead, as discussed hereinabove, the BIC of the GaN film must be below the BIL for such material, in order for the background impurities to be compensatable to yield a semi-insulating GaN material.

The dislocation density of the GaN:Fe wafer was measured by counting the etch pit density with an atomic force microscope (AFM) after chemical mechanical polishing (CMP). The chemical mechanical polish decorates dislocations with a slightly different polishing rate in the vicinity of the dislocation. The dislocation density of the GaN:Fe sample with an Fe concentration of $10^{19}$ cm$^{-3}$ was approximately $8\times10^6$ cm$^{-2}$, similar to that measured for samples grown under the same growth conditions, but with iron absent.

Figure 4:
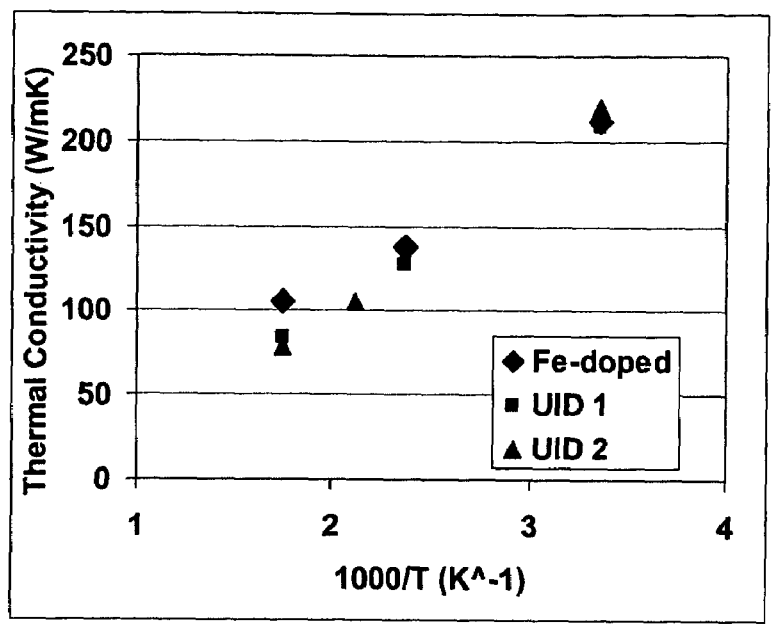
FIG. 4 shows a plot of thermal conductivity vs. inverse temperature for the Fe doped sample of Example 4, having an Fe concentration of $10^{19}$ cm$^{-3}$ and two unintentionally doped (UID) GaN samples grown under similar conditions without the iron.

The thermal conductivity of the GaN:Fe wafer was measured by the laser flash method at different sample temperatures. FIG. 4 shows a plot of thermal conductivity vs. inverse temperature for the Fe doped sample with an Fe concentration of $10^{19}$ cm$^{-3}$ and two unintentionally doped (UID) GaN samples grown under similar conditions without the iron. The thermal conductivity of the first GaN:Fe sample with an Fe concentration of $10^{19}$ cm$^{-3}$ was 210 W/mK at room temperature (~25° C.), similar to that measured for samples grown under the same growth conditions, but with iron absent. The thermal conductivity of several foreign templates is given in Table IV.A below for comparison. The thermal conductivity is much larger than that of sapphire templates typically used during heteroepitaxy.

TABLE IV A

| UID: Unintentionally doped GaN: comparison of thermal conductivity of other GaN substrates | |
|---|---|
| Sapphire | 30 W/mK |
| SiC | 300–380 W/mK |
| Si | 140 W/mK |
| HVPE | 220 W/mK |

EXAMPLE 5

Transition metal doped HVPE GaN using volatile metalorganic as dopant source. This example shows the incorporation of a deep acceptor species in a growing GaN film from a metalorganic precursor, via bubbler delivery.

This example demonstrated the incorporation of a transition metal in the GaN crystal material, using a metal compound of bis(cyclopentadienyl) as the metal precursor, supplied from a bubbler outside of the reactor. Ferrocene ((bis(cyclopentadienyl)iron), Cp$_2$Fe) was the specific precursor compound used in this example.

The gas stream from the bubbler was mixed with ammonia inside the reactor. 250 grams of 99.99999% gallium were loaded into the gallium boat (reservoir) at room temperature (~25° C.). The reactor was sealed and the reactor temperature was raised to the growth temperature. GaN crystals were grown on a sapphire template using the baseline growth conditions. The growth conditions were: growth temperature=1030° C., growth pressure=50 Torr, and growth rate=about 100 μm/hour. Nitrogen carrier gas was flowed through the ferrocene bubbler and the bubbler was maintained at a temperature of 43° C. The flow rate of the bubbler carrier gas was 200 sccm.

After one-hour growth on a sapphire substrate, the GaN crystals were removed from the reactor and characterized. Iron and other impurity concentrations in the GaN crystal were analyzed by SIMS technique.

Table V shows the impurity concentrations that were measured by SIMS. The carbon impurity in the crystal was at the detection limit of the SIMS device, suggesting that the metal-organic precursor did not introduce a significant amount of carbon impurity to the crystal during the growth process. The high oxygen concentration in the crystal was due to a leak into the reactor during this growth. Subsequent growth with better leak-tightness of the reactor resulted in a substantially reduced oxygen impurity level.

TABLE V

| Impurity Concentration Measured by SIMS and GDMS in the GaN Crystal Grown in Example 5 | |
|---|---|
| Element | SIMS (cm$^{-3}$) |
| Fe | $2.1 \times 10^{18}$ |
| Si | $2.8 \times 10^{16}$ |
| O | $5.4 \times 10^{18}$ |
| C | $8.3 \times 10^{16}$ |

EXAMPLE 6

Transition Metal Doping with a Separate Dopant Boat Inside the Reactor

This example demonstrated the incorporation of a transition metal in a GaN crystal, using a separate metal boat inside the growth reactor. In addition to the gallium boat, the reactor was arranged to contain a separate boat for transition metal doping.

800 grams of 99.99999% gallium were loaded into the gallium boat, and 5 grams of 99.995% pure iron wire were loaded into the dopant boat. A baseline growth condition was first established without dopant flow. The baseline growth conditions were: The baseline growth conditions were: growth temperature=1040° C., growth pressure=atmospheric pressure, growth rate=125 μm/hr.

In a subsequent growth process, the HCl flow for the dopant boat was turned on, while other conditions were identical to the baseline growth condition. HCl reacted with metallic iron, forming iron chloride that was carried to the growth zone. The HCl flow for the dopant boat was 5 sccm and HCl flow for the gallium boat was 50 sccm. A sapphire substrate was used and the GaN film thickness obtained was 60 μm.

Figure 5:
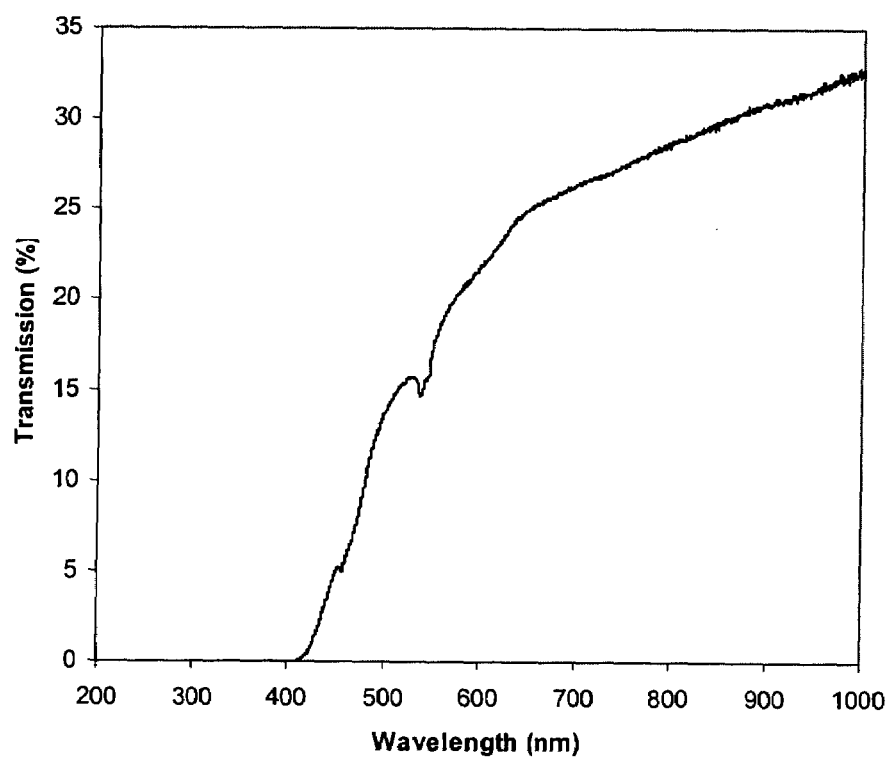
FIG. 5 is a UV-VIS transmission spectrum, wherein % transmission is plotted as a function of wavelength in nanometers (nm), for the GaN film formed in Example 6.

The presence of iron in the film was evident by UV-VIS transmission spectrum shown in FIG. 5, wherein % transmission is plotted as a function of wavelength in nanometers (nm). Higher HCl flows (>5 sccm for the reactor configuration used in this example) to the iron boat led to etching of gallium nitride at the baseline growth condition. Although lower HCl flows or less iron chloride would be preferred to achieve semi-insulative character, this example demonstrates that sufficient Fe can be incorporated into the GaN crystal when HCl is passed over Fe in a separate metal boat.

EXAMPLE 7

General Example for Transition Metal Doping with a Separate Dopant Boat Inside the Reactor This example demonstrates the incorporation of transition metal in the GaN crystal, using a separate dopant metal boat inside the reactor, similar to example 6. In addition to the gallium boat, the reactor contains a separate boat for the transition metal doping. 800 grams of 99.99999% gallium are loaded to into the gallium boat, and 5 grams of 99.995% metallic element chosen from Table VI are loaded into the dopant boat. A baseline growth condition is first established without dopant flow. The baseline growth conditions are: growth temperature=1000–1050° C., growth pressure=atmospheric pressure, growth rate=100–250 μm/hr. In a subsequent growth, the HCl flow for the dopant boat is turned on, while other conditions are identical to the baseline growth condition. The HCl flow is 1–100 sccm. The transition metal element is transported to the growth zone by HCl and carrier gas, incorporating the transition metal dopant into the growing GaN crystal.

The foregoing generalized procedure is carried out for each of the metal elements listed in Table VI below.

TABLE VI

Metal elements for Example 7.

Cr, Mo, W, Mn, Re, Fe, Ru, Os, Co, Rh, Ir, Ni, Pd, Pt, Cu, Ag, Au, Zn, Cd and Hg.

EXAMPLE 8

General Example Using Metal-organic as Transition Metal Doping Source

This example demonstrates the incorporation of transition metal in the GaN crystal material, using metal compound supplied from a bubbler outside of the reactor. One of the metal-organic compounds chosen from Table VII is used. 250–7000 grams of 99.99999% gallium are loaded into the gallium boat (reservoir) at room temperature (~25° C.). The reactor is sealed and the reactor temperature is raised to the growth temperature. A baseline growth condition is first established without bubble flow. The baseline growth conditions are: growth temperature=1000–1050° C., growth pressure=atmospheric pressure, growth rate=100–250 μm/hr. In a subsequent growth, the bubble flow is turned on, while other conditions are identical to the baseline growth condition. The transition metal element is transported to the growth zone by the bubbler carrier gas, incorporating into the growing GaN crystal.

The foregoing generalized procedure is carried out for each of the metal-organic compounds listed in Table VII below.

TABLE VII

Metal-organic compounds for example 8

Bis(cyclopentadienyl)chromium
Bis(cyclopentadienyl)cobalt
Bis(cyclopentadienyl)iron
Bis(cyclopentadienyl)manganese
Bis(cyclopentadienyl)molybdenum dichloride
Bis(cyclopentadienyl)nickel

TABLE VII-continued

Metal-organic compounds for example 8

Bis(cyclopentadienyl)osmium
Bis(cyclopentadienyl)ruthenium
Bis(cyclopentadienyl)tungsten dichloride
Dimethylzinc The foregoing examples illustrate the approach of the invention for forming large area, free-standing semi-insulating gallium nitride, and the characteristics of the large area, free-standing, semi-insulating gallium nitride that is produced by such growth techniques. Semi-insulating gallium nitride manufactured in accordance with the invention is a useful substrate material for the fabrication of electronic and/or optoelectronic GaN devices, including GaN devices that heretofore have been fabricated on heteroepitaxial substrates such as sapphire, silicon carbide, etc.

While the invention has been variously described herein with respect to specific features, aspects and embodiments, it will be appreciated that the scope of the invention is not thus limited, but rather extends to and includes such modifications, variations and other embodiments as will readily suggests themselves to those of ordinary skill in the art, based on the disclosure herein.

Accordingly, the invention is intended to be broadly construed, as encompassing all such other modifications, variations and alternative embodiments, as being within the spirit and scope of the invention as hereinafter claimed.

What is claimed is:

1. Single-crystal semi-insulating gallium nitride having a resistivity greater than about $10^5$ Ω-cm, having a thickness of at least about 50 micrometers, and having a diameter of at least about 25 millimeters.

2. Gallium nitride according to claim 1, doped with a transition metal dopant species to compensate residual donor species in the gallium nitride, wherein the concentration of transition metal dopant species is sufficient to render the gallium nitride semi-insulating.

3. Gallium nitride according to claim 2, wherein the transition metal dopant species comprises at least one transition metal selected from the group consisting of Cr, Mo, W, Mn, Re, Fe, Ru, Os, Co, Rh, Ir, Ni, Pd, Pt, Cu, Ag, Au, Zn, Cd and Hg.

4. Gallium nitride according to claim 2, wherein the transition metal dopant species comprises at least one transition metal selected from the group consisting of Mn, Fe, Co, Ni and Cu.

5. Gallium nitride according to claim 2, wherein the transition metal dopant species comprises manganese.

6. Gallium nitride according to claim 2, wherein the transition metal dopant species comprises cobalt.

7. Gallium nitride according to claim 2, wherein the transition metal dopant species comprises nickel.

8. Gallium nitride according to claim 2, wherein the transition metal dopant species comprises copper.

9. Gallium nitride according to claim 2, wherein the transition metal dopant species comprises iron.

10. Gallium nitride according to claim 2, comprising background impurities including silicon and oxygen, wherein said transition metal dopant species comprises iron, and said iron has a concentration that is greater than total concentration of said silicon and said oxygen.

11. Gallium nitride according to claim 2, wherein said transition metal dopant species comprises iron, at a concentration in a range of from about $3\times10^{16}$ atoms/cm$^3$ to about $7\times10^{17}$ atoms/cm$^3$, as determined by SIMS.

12. Gallium nitride according to claim 1, as formed by hydride vapor phase epitaxy (HVPE).

13. Gallium nitride according to claim 1, with a thickness in a range of from about 50 micrometers to about 5 centimeters.

14. Gallium nitride according to claim 1, in the form of a boule.

15. Gallium nitride according to claim 14, wherein the boule has a thickness in a range of from about 300 micrometers to about 5 centimeters.

16. Gallium nitride according to claim 1, which is free-standing.

17. Gallium nitride according to claim 16, having a diameter of at least 50 millimeters, and a thickness of at least 300 micrometers.

18. Gallium nitride according to claim 17, wherein the thickness is in a range of from 300 micrometers to 5 centimeters.

19. Gallium nitride according to claim 1, having a resistivity greater than about $10^5$ $\Omega$-cm, at 25° C.

20. Gallium nitride according to claim 1, having a resistivity greater than about $10^5$ $\Omega$-cm, at 200° C.

21. Gallium nitride according to claim 1, having a resistivity greater than about $10^5$ $\Omega$-cm, at 300° C.

22. Gallium nitride according to claim 1, wherein unintentional impurities are less than $5\times10^{17}$ cm$^{-3}$.

23. Gallium nitride according to claim 1, wherein unintentional impurities are less than $1\times10^{17}$ cm$^{-3}$.

24. Gallium nitride according to claim 1, wherein unintentional impurities are less than $5\times10^{16}$ cm$^{-3}$.

25. Gallium nitride according to claim 1, wherein unintentional impurities are less than $1\times10^{16}$ cm$^{-3}$.

26. Gallium nitride according to claim 1, having a dislocation defect density not exceeding $10^7$ defects /cm$^2$.

27. Gallium nitride according to claim 1, having a dislocation defect density not exceeding $10^6$ defects /cm$^2$.

28. Gallium nitride according to claim 1, having a dislocation defect density not exceeding $10^5$ defects /cm$^2$.

29. Gallium nitride according to claim 1, doped with a dopant species to compensate residual donor species in the gallium nitride, wherein the dopant species has an activation energy greater than 0.35 eV.

30. Gallium nitride according to claim 1, doped with a dopant species to compensate residual donor species in the gallium nitride, wherein the dopant species has an activation energy greater than 0.50 eV.

31. Gallium nitride according to claim 1, doped with a dopant species to compensate residual donor species in the gallium nitride, wherein the dopant species has an activation energy greater than 0.75 eV.

32. Gallium nitride according to claim 1, doped with a transition metal dopant species having an activation energy greater than 0.35 eV.

33. Gallium nitride according to claim 1, including microelectronic circuitry fabricated thereon and/or therein, wherein the gallium nitride is semi-insulating in an operating temperature regime of said microelectronic circuitry.

34. Gallium nitride according to claim 1, having electronic circuitry fabricated thereon and/or therewithin.

35. An electronic device structure, comprising gallium nitride as in claim 1, and an electronic device fabricated thereon and/or therewithin.

36. The electronic device structure of claim 35, wherein the electronic device comprises a high electron mobility transistor (HEMT).

37. The electronic device structure of claim 35, wherein the electronic device comprises a monolithic microwave integrated circuit (MMIC).

38. The electronic device structure of claim 35, wherein said gallium nitride is on a conductive substrate.

39. The electronic device structure of claim 38, wherein the electronic device comprises a high power rectifier.

40. A method of forming large area, semi-insulating gallium nitride, comprising growing gallium nitride material by a growth process to a thickness of at least about 50 micrometers and a diameter of at least about 25 millimeters, and during the growth process, doping the growing gallium nitride with a dopant species that is effective to compensate residual donor species in the gallium nitride, wherein the concentration of the dopant species is sufficient to render the gallium nitride semi-insulating with a resistivity greater than about $10^5$ $\Omega$-cm.

41. The method of claim 40, wherein the dopant species comprises at least one transition metal selected from the group consisting of Cr, Mo, W, Mn, Re, Fe, Ru, Os, Co, Rh, Ir, Ni, Pd, Pt, Cu, Ag, Au, Zn, Cd and Hg.

42. The method of claim 40, wherein the dopant species comprises at least one transition metal selected from the group consisting of Mn, Fe, Co, Ni and Cu.

43. The method of claim 40, wherein the dopant species comprises manganese.

44. The method of claim 40, wherein the dopant species comprises cobalt.

45. The method of claim 40, wherein the dopant species comprises nickel.

46. The method of claim 40, wherein the dopant species comprises copper.

47. The method of claim 40, wherein the dopant species comprises iron.

48. The method of claim 40, wherein the gallium nitride contains background impurities including silicon and oxygen, wherein said dopant species comprises iron, and said iron has a concentration that is greater than total concentration of said silicon and said oxygen.

49. The method of claim 40, wherein said dopant species comprises iron, and the growth process is conducted to provide the gallium nitride with an iron concentration in a range of from about $3\times10^{16}$ atoms/cm$^3$ to about $7\times10^{17}$ atoms/cm$_3$, as determined by SIMS.

50. The method of claim 40, wherein the growth process comprises hydride vapor phase epitaxy (HVPE).

51. The method of claim 40, wherein the gallium nitride has a resistivity greater than about $10^5$ $\Omega$-cm, at 25° C.

52. The method of claim 40, wherein the gallium nitride has a resistivity greater than about $10^5$ $\Omega$-cm, at 200° C.

53. The method of claim 40, wherein the gallium nitride has a resistivity greater than about $10^5$ $\Omega$-cm, at 300° C.

54. The method of claim 40, wherein the dopant species has an activation energy greater than 0.35 eV.

55. The method of claim 40, wherein the dopant species has an activation energy greater than 0.50 eV.

56. The method of claim 40, wherein the dopant species has an activation energy greater than 0.75 eV.

57. The method of claim 40, wherein unintentional impurities of the gallium nitride are less than $5\times10^{17}$ cm$^{-3}$.

58. The method of claim 40, wherein unintentional impurities of the gallium nitride are less than $1\times10^{17}$ cm$^{-3}$.

59. The method of claim 40, wherein unintentional impurities of the gallium nitride are less than $5\times10^{16}$ cm$^{-3}$.

60. The method of claim 40, wherein unintentional impurities of the gallium nitride are less than $1\times10^{16}$ cm$^{-3}$.

61. The method of claim 40, wherein the gallium nitride has a dislocation density not exceeding $10^7$ defects /cm$^2$.

62. The method of claim 40, wherein the gallium nitride has a dislocation density not exceeding $10^6$ defects /cm$^2$.

63. The method of claim 40, wherein the gallium nitride has a dislocation density not exceeding $10^5$ defects /cm$^2$.

64. The method of claim 40, wherein the gallium nitride produced by the growth process is free-standing.

65. The method of claim 64, wherein the gallium nitride has a diameter of at least 50 millimeters, and a thickness of at least 300 micrometers.

66. The method of claim 65, wherein the gallium nitride has a thickness in a range of from 300 micrometers to 5 centimeters.

67. The method of claim 40, comprising growing the gallium nitride to form a boule by an HVPE growth process.

68. The method of claim 40, further comprising fabricating electronic circuitry on and/or within the gallium nitride.

69. The method of claim 40, further comprising fabricating an electronic device on and/or within the gallium nitride.

70. The method of claim 40, comprising forming said gallium nitride on a conductive substrate.

71. The method of claim 40, wherein said growth process comprises growing gallium nitride on a seed crystal.

72. The method of claim 71, wherein the seed crystal comprises a free-standing GaN seed crystal.

73. The method of claim 71, wherein said growth process comprises growing gallium nitride on a conductive seed crystal, said method further comprising removing the conductive seed crystal from the gallium nitride produced by the growth process.

74. The method of claim 71, wherein the seed crystal comprises a semi-insulating seed crystal.

75. The method of claim 71, wherein the seed crystal comprises a seed crystal having a defect density of less than $10^7$ defects/cm$^2$.

76. The method of claim 40, wherein the growth process comprises reacting hydrochloric acid (HCl) with metallic gallium to form gaseous GaCl, and reacting the gaseous GaCl with NH$_3$ to form the large area, semi-insulating gallium nitride.

77. The method of claim 40, wherein the growth process comprises reacting gallium chloride with ammonia to form the large area, semi-insulating gallium nitride.

78. The method of claim 40, wherein the growth process comprises an HVPE growth process, and the HVPE growth process is carried out to produce gallium nitride with a dislocation defect density not exceeding $10^7$ defects/cm$^2$.

79. The method of claim 40, wherein the growth process comprises an HVPE growth process, and the HVPE growth process is carried out to produce gallium nitride with a dislocation defect density not exceeding $10^6$ defects/cm$^2$.

80. The method of claim 40, wherein the growth process comprises a multiple-stage HVPE growth process.

81. The method of claim 40, wherein the growth process comprises an HVPE growth process, wherein reactants NH$_3$ and HCl are supplied in a ratio NH$_3$/HCl that is in a range of from about 2 to about 40.

82. The method of claim 40, wherein the growth process comprises an HVPE growth process, wherein the HVPE growth process is carried Out with growth rate in a range of from about 50 to about 250 micrometers per hour, growth temperature in a range of from about 950 to about 1150° C., pressure in a range of from about 25 to about 760 torr, and V/III ratio in a range of from about 2 to about 50.

83. The method of claim 40, wherein the dopant species comprises a transition metal, and the growth process comprises mixing the transition metal with a gallium source, thereby forming a solution of the transition metal impurity in gallium.

84. The method of claim 40, wherein the growth process comprises an HVPE growth process and the dopant species comprises a transition metal, wherein the HVPE growth process comprises reacting the transition metal dopant species with HCl to convert transition metal to gaseous metal chloride.

85. The method of claim 40, wherein the growth process comprises an HVPE growth process including reacting hydrochloric acid with metallic gallium to form gaseous gallium chloride, and reacting the gaseous gallium chloride with ammonia to form said large-area, semi-insulating gallium nitride.

86. The method of claim 85, wherein the step of reacting the gaseous gallium chloride with ammonia is conducted in a growth zone, and the dopant species comprises a transition metal in the growth zone in a form in which the transition metal is incorporated in the growing gallium nitride.

87. The method of claim 40, wherein the growth process comprises reacting the dopant species with HCl to convert the dopant species into a gaseous chloride.

88. The method of claim 40, wherein the growth process comprises providing a transition metal chloride in a growth zone in which the growth process is conducted.

89. The method of claim 40, wherein the dopant species is derived from a transition metal precursor that is introduced to the growth process.

90. The method of claim 89, wherein the transition metal precursor comprises a metal organic precursor.

91. The method of claim 90, wherein the metalorganic precursor comprises a bis(cyclopentadienyl) compound of the transition metal.

92. The method of claim 91, wherein the transition metal comprises a metal selected from the group consisting of iron, manganese, cobalt, nickel, chromium and copper.

93. The method of claim 40, wherein the dopant species is delivered by bubbler delivery to the growth process.

94. The method of claim 40, wherein the growth process comprises growing the large-area, semi-insulating gallium nitride on a heteroepitaxial substrate.

95. The method of claim 94, wherein the heteroepitaxial substrate comprises a material selected from the group consisting of sapphire and silicon carbide.

96. The method of claim 94, further comprising removing the heteroepitaxial substrate from the large-area, semi-insulating gallium nitride, to yield free-standing large-area, semi-insulating gallium nitride.

97. The method of claim 96, wherein removal of the heteroepitaxial substrate from the large-area, semi-insulating gallium nitride, comprises a step selected from the group consisting of grinding, chemical etching, dry etching, parting techniques and liftoff techniques.

98. The method of claim 96, wherein removal of the heteroepitaxial substrate from the large-area, semi-insulating gallium nitride, comprises reactive ion etching.

99. The method of claim 96, wherein removal of the heteroepitaxial substrate from the large-area, semi-insulating gallium nitride, comprises in situ removal of the heteroepitaxial substrate at or in the vicinity of growth temperature of the large-area, semi-insulating gallium nitride.

100. The method of claim 96, wherein removal of the heteroepitaxial substrate from the large-area, semi-insulating gallium nitride, comprises fracturing the heteroepitaxial substrate from the large-area, semi-insulating gallium nitride.

101. The method of claim 96, wherein removal of the heteroepitaxial substrate from the large-area, semi-insulating gallium nitride, comprises use of a parting layer between the heteroepitaxial substrate and the large-area, semi-insulating gallium nitride.

102. The method of claim 96, wherein removal of the heteroepitaxial substrate from the large-area, semi-insulating gallium nitride, comprises impinging energy on an interface between the heteroepitaxial substrate and the large-area, semi-insulating gallium nitride, to weaken the interface and cause separation of the heteroepitaxial substrate from the large-area, semi-insulating gallium nitride.

103. The method of claim 40, wherein the large area, semi-insulating gallium nitride is formed as a boule, further comprising forming wafer blanks from said boule.

104. The method of claim 103, wherein the step of forming wafer blanks from said boule comprises sawing wafer blanks from the boule.

105. The method of claim 103, further comprising at least one processing step selected from the group consisting of lapping, polishing and planarization operations.

106. The method of claim 105, wherein the wafer blank after said at least one processing step has a dislocation defect level on a surface thereof that is below $10^6$ defects $cm^{-3}$.

107. The method of claim 40, wherein said dopant species comprises iron, and said large-area, semi-insulating gallium nitride has iron doped therein at concentration in a range of from about $3\times10^{16}$ atoms/$cm^3$ to about $7\times10^{17}$ atoms/$cm^3$, as determined by SIMS.

108. The method of claim 40, further comprising fabricating a microelectronic circuitry on and/or in the gallium nitride, wherein the gallium nitride is semi-insulating in an operating temperature regime of said microelectronic circuitry.

109. The method of claim 40, further comprising using the large-area, semi-insulating gallium nitride as a substrate for an electronic device.

110. A method of forming large area, semi-insulating gallium nitride, comprising growing gallium nitride material to a thickness of at least about 50 micrometers and a diameter of at least about 25 millimeters by a growth process in which donor species in the growing gallium nitride are compensated, by introducing into the growing gallium nitride one or more deep acceptor species in a sufficient amount to compensate the donor species and produce semi-insulating GaN material with a resistivity treater than about $10^5$ $\Omega$-cm.

111. The method of claim 110, further comprising maintaining BIC below BIL during the growth process.

112. The method of claim 110, wherein said acceptor species comprises iron, and BIC is below $5.0\times10^{17}$ $cm^{-3}$.

* * * * *

UNITED STATES PATENT AND TRADEMARK OFFICE
CERTIFICATE OF CORRECTION

| | |
|---|---|
| PATENT NO. | : 7,170,095 B2 |
| APPLICATION NO. | : 10/618024 |
| DATED | : January 30, 2007 |
| INVENTOR(S) | : Robert P. Vaudo et al. |

It is certified that error appears in the above-identified patent and that said Letters Patent is hereby corrected as shown below:

On the title page, item [56]:
In page 2, References Cited, Other Publications, First column, third entry, "Valudo et al." should be -- Vaudo et al. --.

In column 14, line 46, "$1.1\times1019$ cm$^3$" should be -- $1.1\times10^{19}$ cm$^{-3}$ --.

In column 20, line 44 (claim 40), "atoms/cm$_3$" should be -- atoms/cm$^3$ --.

In column 21, line 61 (claim 61), "carried Out with" should be --carried out with --.

Signed and Sealed this

First Day of May, 2007

JON W. DUDAS
*Director of the United States Patent and Trademark Office*